United States Patent
Joo et al.

(10) Patent No.: US 8,017,939 B2
(45) Date of Patent: Sep. 13, 2011

(54) ORGANIC MEMORY DEVICE INCLUDING A METALLIC NANOPARTICLE MONOLAYER

(75) Inventors: Won Jae Joo, Yongin-si (KR); Seong Jae Choi, Yongin-si (KR); Jae Young Choi, Yongin-si (KR); Sang Kyun Lee, Yongin-si (KR); Kwang Hee Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 144 days.

(21) Appl. No.: 11/790,178

(22) Filed: Apr. 24, 2007

(65) Prior Publication Data

US 2008/0157066 A1    Jul. 3, 2008

(30) Foreign Application Priority Data

Dec. 28, 2006    (KR) .................. 10-2006-0136287

(51) Int. Cl.
*H01L 51/00*    (2006.01)
*H01L 51/30*    (2006.01)
*H01L 51/40*    (2006.01)

(52) U.S. Cl. ........... 257/40; 257/E51.003; 257/E51.029; 257/E51.034; 257/E51.045; 438/99; 438/381

(58) Field of Classification Search .................. 257/40
See application file for complete search history.

(56) References Cited

U.S. PATENT DOCUMENTS

| | | | | |
|---|---|---|---|---|
| 5,677,545 A | * | 10/1997 | Shi et al. ........................... | 257/40 |
| 6,162,532 A | * | 12/2000 | Black et al. ..................... | 428/323 |
| 7,491,968 B2 | * | 2/2009 | Kang et al. ....................... | 257/40 |
| 2004/0265755 A1 | | 12/2004 | Park et al. | |
| 2005/0040455 A1 | * | 2/2005 | Bozano et al. ................ | 257/314 |
| 2005/0145995 A1 | * | 7/2005 | Kobashi et al. ................ | 257/642 |
| 2005/0227382 A1 | * | 10/2005 | Hui ................. | 438/14 |
| 2005/0274943 A1 | * | 12/2005 | Chen ................. | 257/40 |
| 2006/0175653 A1 | * | 8/2006 | Joo et al. ........................ | 257/314 |
| 2007/0126001 A1 | * | 6/2007 | Choi et al. ...................... | 257/40 |

OTHER PUBLICATIONS

Milo S. P. Shaffer, et al., "Fabrication and Characterization of Carbon Nanotube/Poly(vinyl alcohol) Composites," Advanced Materials, No. 11. pp. 937-941, (1999).
Xiaoyi Gong, et al., "Surfactant-Assisted Processing of Carbon Nanotube/Polymer Composites," American Chemical Society, Chem. Mater. No. 12, pp. 1049-1052, (2000).
Riichiro Saito, et al., "Electronic structure of graphene tubules based on $C_{60}$," The American Physical Society, vol. 46, No. 3, pp. 1804-1811, Jul. 15, 1992.
Noriaki Hamada, et al., "New One-Dimensional Conductors: Graphitic Microtubules," The American Physical Society, Physical Review Letters, vol. 68, No. 10, pp. 1579-1581, Mar. 9, 1992.

* cited by examiner

*Primary Examiner* — Ha Tran T Nguyen
*Assistant Examiner* — Raj Gupta
(74) *Attorney, Agent, or Firm* — Harness, Dickey & Pierce, P.L.C.

(57) ABSTRACT

The present disclosure relates to an organic memory device and a fabrication method thereof. The organic memory device comprises a first electrode, a second electrode, and an organic memory layer situated between the electrodes, wherein a metallic nanoparticle layer is further situated between the first electrode and the organic memory layer. Since the organic memory device may be operated using only positive voltages, a 1D1R device composed of one diode and one resistor can be realized and a passive matrix can be realized due to the 1D1R structure. Accordingly, the organic memory device enables higher integration, ultrahigh speeds, larger capacities, lower power consumption, and/or lower prices.

14 Claims, 9 Drawing Sheets

ORGANIC MEMORY DEVICE INCLUDING A METALLIC NANOPARTICLE MONOLAYER

PRIORITY STATEMENT

This non-provisional application claims priority under 35 U.S.C. §119(a) to Korean Patent Application No. 10-2006-0136287, filed on Dec. 28, 2006, the contents of which are incorporated herein, in its entirety, by reference.

BACKGROUND

1. Technical Field

Example embodiments are disclosed herein that relate to an organic memory device and a method for fabricating the same. More specifically, example embodiments are disclosed herein that relate to an organic memory device comprising an organic memory layer and a metallic nanoparticle layer formed between a first electrode and a second electrode, and a method for fabricating the organic memory device.

2. Description of the Related Art

Recent dramatic advances in information communication industry and portable information device technology have led to an increasing demand for large-capacity, nonvolatile memory devices. Most currently-available nonvolatile memories are flash memories based on silicon materials. However, conventional flash memories suffer from the technical limitations in that the number of writing/erasing cycles is limited, the writing speed is slow, and miniaturization and high integration of the devices are difficult. In light of these circumstances, much research has been conducted on next-generation nonvolatile memory devices.

For example, great effort is now being actively undertaken to develop next-generation nonvolatile memory devices using an organic material and a polymer as materials for a memory layer of the memory devices to overcome the physical limitations of conventional silicon-based memory devices and achieve the advantages of ultrahigh speed, large capacity, low power consumption, and low cost.

Switching modes of an organic memory device using an organic material and a polymer includes a mode in which electrons are captured by metallic nanoparticles combined with the organic material to induce variations in the resistance of the organic memory device; a mode in which ionic salts contained in a conductive polymer induce variations in the resistance of the organic memory device depending on the distribution of ions; a mode in which the organic memory device is switched by controlling the formation and short-circuiting of metal filaments within an organic memory layer; a mode in which the organic memory device is switched by changing the structural configuration and redox states of molecules present in an organic memory layer; and other switching modes as well.

Organic memory devices (also termed metal filament memories) are currently being investigated as new-generation memory devices. Metal filament memories utilize a phenomenon where resistance values are varied by the formation and short-circuiting of metal filaments within an organic memory layer that are present between two electrodes. Metal filament memories become an 'ON' state (a low resistance state) when metal filaments are formed, and an 'OFF' state (a high resistance state) when metal filaments are short-circuited. A voltage or a pulse signal higher than a critical value is applied to an organic memory device to write data in a memory cell, and a voltage or an electric field having a polarity is applied to the organic memory device to read data from the memory cell. On the other hand, to erase data written in the memory cell, a voltage or a pulse having a polarity opposite to that of the writing signal is applied to the organic memory device.

As explained above, conventional organic memory devices are operable only when both positive and negative voltages are applied thereto, thus necessitating the use of a plurality of transistors. Accordingly, 1-diode 1-resistor (1D1R) memory devices cannot be realized, which makes it difficult to achieve miniaturization and high integration of the memory devices.

SUMMARY OF EXAMPLE EMBODIMENTS

Example embodiments have been made in view of the shortcomings of the prior art. Accordingly, example embodiments have been provided that disclose an organic memory device that is capable of being set-switched or reset-switched using only positive voltages to realize a 1D1R structure.

Example embodiments are provided that disclose an organic memory device that possesses the advantages of short resistance/impedance switching time, low operation voltage, low fabrication cost, high reliability, long life cycle, possible three-dimensional packing, related low-temperature processing, low weight, and high density/high integration.

Example embodiments are provided that disclose a method for fabricating an organic memory device by a simplified procedure, thereby reducing costs.

Example embodiments are provided that disclose an organic memory device comprising a first electrode, a second electrode, a metallic nanoparticle layer, and an organic memory layer, wherein the organic memory layer may be situated or sandwiched between the first and second electrodes, and the metallic nanoparticle layer may be situated or sandwiched between the organic memory layer and the first electrode. "Situated" or "sandwiched," as used herein, merely means that the materials may be in contact with each other but need not be so as to exclude the presence of one or more intervening or adjacent layers or medium.

Example embodiments are provided that disclose an organic memory device comprising a first electrode, a metallic nanoparticle layer situated on the first electrode, an organic memory layer made of an electrically-conductive organic material containing heteroatoms and situated on the metallic nanoparticle layer, and a second electrode situated on the organic memory layer. The term "on," as used herein, allows the materials to be in direct contact with each other but does not preclude the presence of other intervening or adjacent layers or medium.

The size of the metallic nanoparticles constituting the metallic nanoparticle layer may be in the range of about 1-10 nm, but is not limited to this range. Examples of suitable metallic nanoparticles may include, but are not necessarily limited to, metallic nanoparticles of gold, silver, copper, platinum, palladium, tungsten, nickel, tantalum, bismuth, lead, tin, zinc, titanium, aluminum, and their alloys.

The electrically-conductive organic material constituting the organic memory layer may have an electrical conductivity of about $1.0 \times 10^{-12}$ S/cm or greater, and the heteroatoms may be sulfur (S) or nitrogen (N) atoms.

The electrically-conductive organic material may be a polymer, a single molecule, an oligomer, or a dendrimer. Examples of polymers that may be used include, but are not limited to, a homopolymer, a copolymer such as a random copolymer, a graft copolymer or a star-block copolymer, a mixture of different polymers, or a mixture of a polymer and a functional monomer. Suitable electrically-conductive polymers containing heteroatoms that may be used include, but are not limited to, aniline homopolymers and copolymers, pyrrole homopolymers and copolymers, and vinylpyridine homopolymers and copolymers. Specific examples of such electrically-conductive polymers include, but are not necessarily limited to, polythiophene, poly(3-alkyl)thiophene, polypyrrole, polysiloxane carbazole, polyisothianapthelene, polyethylene dioxythiophene, poly(3-hexyl)thiophene, polyaniline, and mixtures thereof.

Example embodiments are provided that disclose a method for fabricating an organic memory device comprising a first electrode, a second electrode, and an organic memory layer formed in between, the method comprising the steps of forming a first electrode on a substrate, forming a metallic nanoparticle layer on the first electrode, forming an organic memory layer made of an electrically-conductive organic material containing heteroatoms on the metallic nanoparticle layer, and forming a second electrode on the organic memory layer.

BRIEF DESCRIPTION OF THE DRAWINGS

The above and other objects, features, and advantages of the disclosure will be more clearly understood from the following detailed description in conjunction with the accompanying drawings.

DETAILED DESCRIPTION OF EXAMPLE EMBODIMENTS

Figure 1:
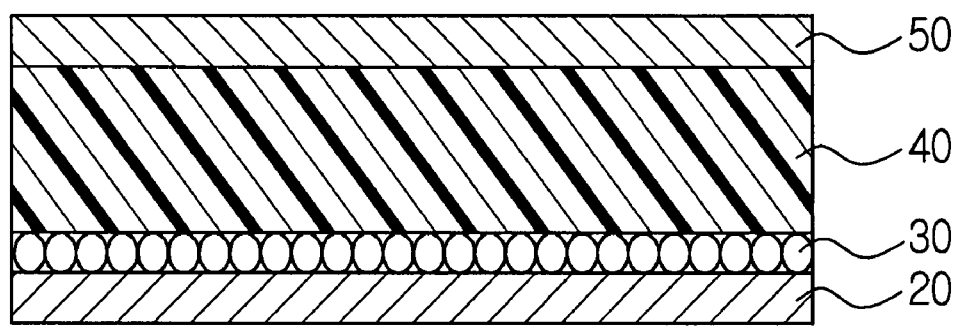
FIG. 1 is a schematic cross-sectional view of an organic memory device (or a memory cell) according to an example embodiment.

Various example embodiments will now be described in greater detail with reference to the accompanying drawings.

On a basic level, an organic memory device may be a memory device comprising a first electrode, a second electrode, and an organic memory layer formed in between.

Switching modes of the organic memory device include a mode where electrons may be captured by metallic nanoparticles present in the organic memory layer to induce variations in the resistance of the organic memory device; a mode where ionic salts contained in a conductive polymer induce variations in the resistance of the organic memory device depending on the distribution of ions; a mode where the organic memory device is switched by controlling the formation and short-circuiting of metal filaments within an organic memory layer; and a mode where the organic memory device is switched by changing the structural configuration and redox states of molecules present in an organic memory layer. The organic memory device may be a metal filament memory device in which variations in resistance are induced by the formation and short-circuiting of metal filaments within an organic memory layer.

That is, the organic memory device is switched by variations in resistance resulting from the formation and short-circuiting of metal filaments within an organic memory layer.

Example embodiments herein disclose an organic memory device comprising a first electrode, a second electrode, and an organic memory layer sandwiched in between, wherein a metallic nanoparticle layer may be further sandwiched in between the organic memory layer and the first electrode.

The organic memory device may have a structure comprising a first electrode, a metallic nanoparticle layer, an organic memory layer made of an electrically-conductive organic material comprising heteroatoms, and a second electrode. The organic memory device may further comprise at least one layer.

The metallic nanoparticle layer of the organic memory device may reduce the electron injection barrier to facilitate the formation of metal filaments within the organic memory layer. Particularly, when the surface of the first electrode is oxidized to leave a metal oxide thereon, the metallic nanoparticle layer facilitates the injection of electrons, allowing uniform growth of metal filaments within the organic memory layer.

That is, the formation of metal filaments may be facilitated by the presence of the metallic nanoparticle layer on the first electrode.

When both positive and negative voltages will be applied to operate memory devices, one or more transistors are generally used to form one memory cell. For example, one memory cell may be composed of one transistor and one resistor (1T1R type) or two transistors and one resistor (2T1R type), which makes it impossible to reduce the size of memory devices. In contrast, since the organic memory device disclosed herein can switch between two states (i.e. "0" and "1") by controlling the magnitude of positive voltages applied to the device, a 1D1R device composed of one diode and one resistor can be realized. As a result, since the cell size of the device can be reduced to $4F^2$, large capacity of the device can be accomplished.

In addition, the organic memory device disclosed herein may have a three-dimensional stacking structure in which the constituent layers and electrodes may be stacked in a vertical direction rather than in a horizontal direction. This stacking structure of the organic memory device increases the number of chips that can be integrated per unit area, thus achieving high density/high integration of the memory device.

FIG. 1 is a schematic cross-sectional view of an organic memory device according to an example embodiment.

Referring to FIG. 1, the organic memory device comprises a first electrode 20, a second electrode 50, and an organic memory layer 40 sandwiched in between. The resistance values of the organic memory layer obtained when a voltage is applied to the memory device show bistability, and as a result, memory characteristics of the memory device may be achieved. The memory characteristics of the memory device may be attributed to the characteristics of an organic material constituting the organic memory layer. Accordingly, the memory characteristics may be maintained even when power is cut off, thus ensuring non-volatility of the memory device.

Figure 2:
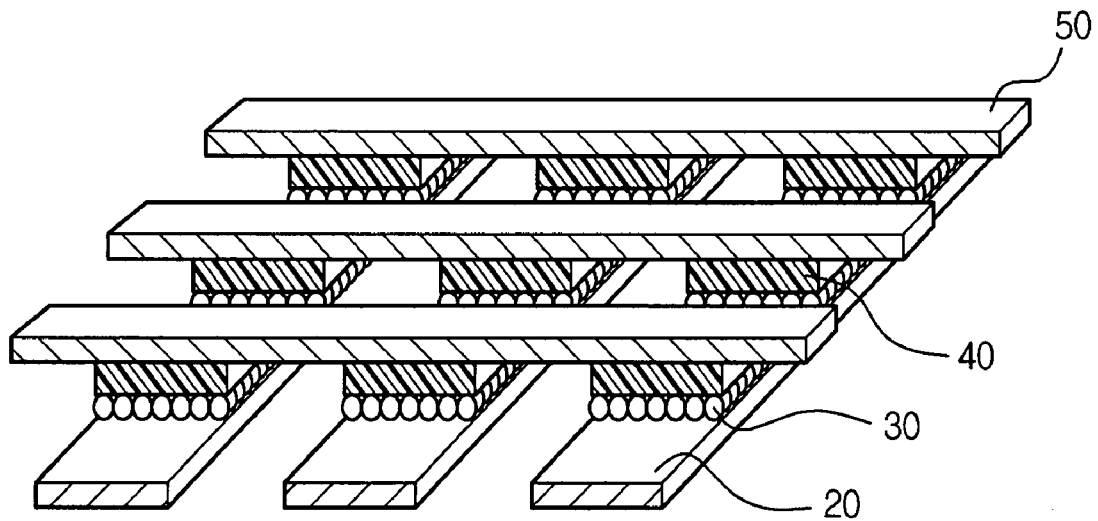
FIG. 2 is a perspective view schematically showing the structure of a memory matrix of organic memory devices according to an example embodiment.
Figure 3:
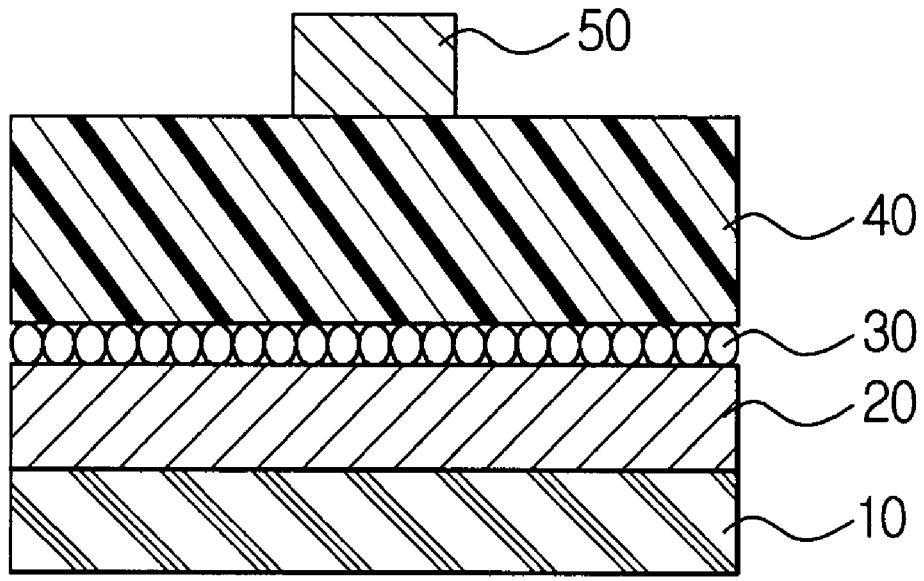
FIG. 3 is a schematic cross-sectional view of an organic memory matrix according to an example embodiment.

FIG. 2 shows a three-dimensional organic memory matrix comprising a plurality of organic memory devices (memory cells). FIG. 3 is a cross-sectional view of the memory matrix. As shown in FIG. 3, the memory matrix may be formed on a suitable substrate 10, such as a glass or silicon substrate, and comprises a plurality of first electrodes 20, a plurality of second electrodes 50, a plurality of metallic nanoparticle layers 30, and a plurality of organic memory layers 40. In the memory matrix, the organic memory layers 40 may be formed between the first electrodes 20 and the second electrodes 50, and the metallic nanoparticle layers 30 may be formed between the first electrodes 20 and the organic memory layers 40. According to this configuration of the memory matrix, a plurality of memory cells, which may be formed at respective intersections between the first electrodes 20 and the second electrodes 50, provide bistability characteristics.

The size of the metallic nanoparticles constituting the metallic nanoparticle layers 30 may be in the range of about 1-10 nm, but is not limited to this range. Examples of such metallic nanoparticles include, but are not necessarily limited to, metallic nanoparticles of gold, silver, copper, platinum, palladium, tungsten, nickel, tantalum, bismuth, lead, tin, zinc, titanium, aluminum, and their alloys.

For the substrate 10, any organic or inorganic substrate, particularly a flexible substrate, may be used. Examples of suitable materials for the substrate include, but are not necessarily limited to, glass, silicon, surface-modified glass, polypropylene, and activated acrylamide.

Figure 5:
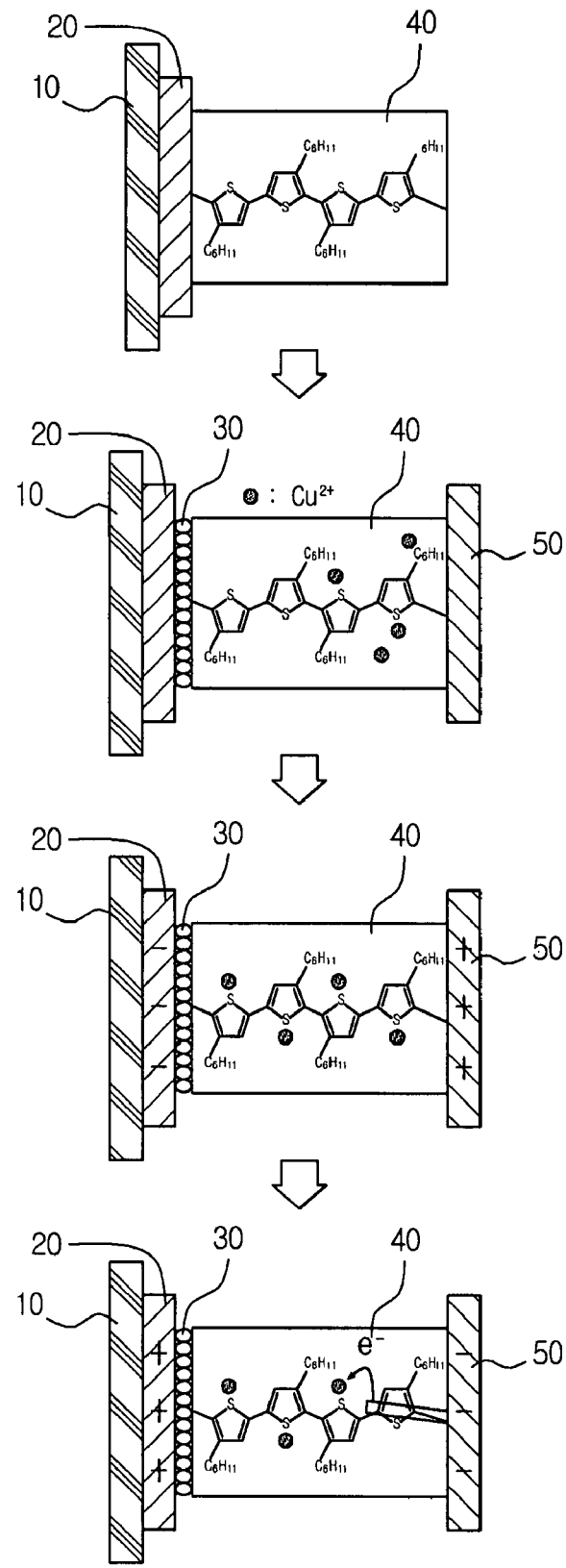
FIG. 5 shows schematic diagrams illustrating the mechanism of switching in an organic memory device of an example embodiment.

The operation mechanism of the organic memory device, where the switching and memory phenomena of the organic memory device may be caused by the formation and short-circuiting of metal filaments, will be explained with reference to FIG. 5. FIG. 5 shows schematic diagrams illustrating the switching mechanism of the organic memory device.

When a positive voltage is applied between the first electrode 20 and the second electrode 50 of the organic memory device, metal ions of the second electrode 2 may be diffused into molecules of an electrically conductive organic material constituting the organic memory layer 40 and interact with heteroatoms contained in the electrically conductive organic material to form complexes. The heteroatoms contained in the electrically conductive organic material serve as bases for the metal ions diffused from the second electrode 50 so that the heteroatoms may react with the metal ions to form complexes. The heteroatoms may be readily coordinated to the metal ions due to the presence of a number of lone pair electrons therein. By the action of the electrically conductive organic material, the metal ions of the second electrode may be present at a constant level in the organic material. Then, when a voltage is applied in a reverse direction (i.e. a negative voltage), the metal ions may be reduced to form metal filaments.

The electrically conductive organic material may have an electrical conductivity of $1.0 \times 10^{-12}$ S/cm or greater, and the heteroatoms may be sulfur (S) or nitrogen (N) atoms. The electrically conductive organic material may be a polymer, a single molecule, an oligomer, or a dendrimer.

The polymer may be, for example, a homopolymer, a copolymer, such as a random copolymer, a graft copolymer or a star-block copolymer, a mixture of different polymers, or a mixture of a polymer and one or more functional monomers.

Suitable electrically conductive polymers containing heteroatoms that may be used may include aniline homopolymers and copolymers, pyrrole homopolymers and copolymers, and vinylpyridine homopolymers and copolymers. Specific examples of such electrically conductive polymers may include, but are not necessarily limited to, polythiophene, poly(3-alkyl)thiophene, polypyrrole, polysiloxane carbazole, polyisothianapthelene, polyethylene dioxythiophene, poly(3-hexyl)thiophene, polyaniline, and mixtures thereof.

It may be beneficial to form the second electrode 50, from which metal ions are diffused, using a highly diffusive metal. Non-limiting examples of such highly diffusive metals include gold, silver, platinum, copper, cobalt, nickel, tin, and aluminum.

The first electrode 20 may be made of at least one electrically conductive material selected from the group consisting of metals, metal alloys, metal nitrides, metal oxides, metal sulfides, carbon polymers, conductive polymers, and organic conductors. Specific examples of materials for the first electrode may include, but are not necessarily limited to, aluminum (Al), gold (Au), silver (Ag), platinum (Pt), copper (Cu), titanium (Ti), tungsten (W), and indium tin oxide (ITO).

Specific examples of conductive polymers that may be used as materials for the first electrode include phenylacetylene polymers, such as polydiphenylacetylene, poly(t-butyl) diphenylacetylene, poly(trifluoromethyl)diphenylacetylene, poly(bistrifluoromethyl)acetylene, polybis(t-butyldiphenyl) acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl) phenylacetylene and derivatives thereof; and thiophene polymers.

Figure 4:
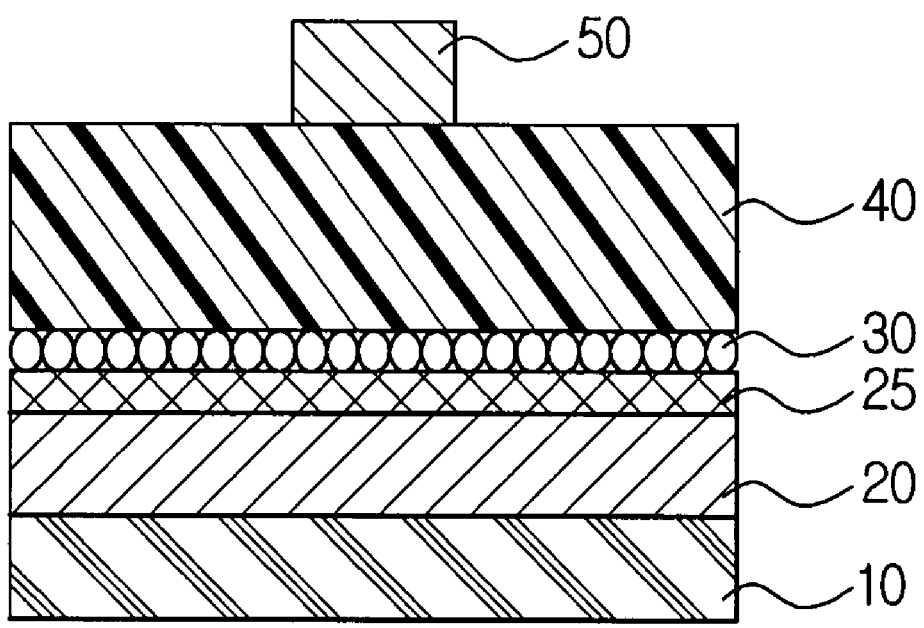
FIG. 4 is a schematic cross-sectional view of an organic memory matrix according to an example embodiment.

The organic memory device may further comprise one or more barrier layers formed on the first electrode or under the second electrode to protect the electrodes from being damaged by the organic material. FIG. 4 is a schematic cross-sectional view of an organic memory matrix in which barrier layer 25 is formed between first electrode 20 and metallic nanoparticle layer 30. Barrier layer 25 may be formed of a material selected from the group consisting of $SiO_x$, $Al_yO_x$, $NbO_x$, $TiO_x$, $CrO_x$, $V_yO_x$, $TaO_x$, $Cu_yO_x$, $MgO_x$, $WO_x$, and $AlNO_x$, wherein x and y have values that may or may not be equal. Examples may include $SiO_2$, $Al_2O_3$, $Cu_2O$, $TiO_2$, and $V_2O_3$. Organic materials, such as Alq3, polymethylmethacrylate, polystyrene, and PET, may also be used to form the barrier layers. The thickness of the barrier layers may be in the range of about 20-300 Å.

Below is a description concerning the operation of the organic memory device according to an example embodiment. The memory device, which comprises a first electrode, an organic memory layer, and a metallic nanoparticle layer formed in between, may be operated using only a positive voltage. This is believed to be because the metallic nanoparticle layer serves to reduce the electron injection barrier and facilitates the injection of electrons into a metal oxide layer formed on the surface of the first electrode to facilitate the formation of metal filaments within the organic memory layer.

Since diodes are connected to respective memory cells of a typical memory matrix having a 1D1R structure, a current flows only in one direction of the memory matrix. In the case where both positive and negative voltages are applied to operate the 1D1R type memory devices, no current flows in the other direction of the memory matrix due to the diodes, and as a result, switching cannot be achieved. In contrast, when the organic memory device disclosed herein is set-switched at a positive voltage of about 2 V, one (1 kohm) of the two resistance states is removed and only one resistance state remains, making 1D1R operation of the memory device possible. Due to this 1D1R operation, a passive matrix can be realized, resulting in high integration, high operation speed, and reduced operation voltage of the memory device.

When a proper electrical voltage is applied between the two electrodes of the organic memory device, the organic memory layer switches between a high resistance state and a low resistance state. That is, the state wherein metal filaments are formed between the first and second electrodes becomes a low resistance set state, and the state wherein metal filaments are short-circuited becomes a high resistance reset state. Assuming that the low resistance state is defined as data "1" and the high resistance state is defined as data "0", two logic states of the data can be stored.

Accordingly, when the set state of the organic memory layer is defined as data "0" and the reset state of the organic memory layer is defined as data "1", "0" can be written by applying a voltage not lower than a set voltage ($V_{set}$) to the organic memory device and "1" can be written by applying a voltage not higher than a reset voltage ($V_{reset}$) to the organic memory device. In addition, data "0" or "1" can be read from the organic memory device by applying a particular voltage within the range of 0 V to the set voltage ($V_{set}$) to the organic memory device, measuring a current flowing through the organic memory device, and comparing the measured current with a reference current. Since the state 0 or 1 is maintained unchanged even when power is cut off, non-volatility of the organic memory device can be ensured.

Example embodiments are also provided relating to a method for fabricating the organic memory device, which comprises a first electrode, a second electrode, and an organic memory layer formed in between.

A method is disclosed comprising the step of forming a metallic nanoparticle layer between the first electrode and the organic memory layer.

The organic memory layer and the metallic nanoparticle layer may be formed by a simple technique, such as spin casting, without involving a high-cost technique, such as e-beam evaporation, in terms of processing and materials. Specifically, the organic memory device may be fabricated by forming a first electrode on a substrate, forming a metallic nanoparticle layer on the first electrode, forming an organic memory layer (made of an electrically-conductive organic material containing heteroatoms) on the metallic nanoparticle layer, and forming a second electrode on the organic memory layer.

The metallic nanoparticle layer may be formed by any wet coating technique. For example, the metallic nanoparticle layer may be formed by dissolving a powder of metallic nanoparticles in a solvent to prepare a colloidal solution of the nanoparticles, uniformly coating the substrate with the solution, and evaporating the solvent. This evaporation of the solvent allows the metallic nanoparticles to spontaneously bind to each other at room temperature, leaving the metallic nanoparticle layer in the form of a thin film having a close-packed monolayer structure on the substrate. Alternatively, the metallic nanoparticle layer may be formed by dispersing metallic nanoparticles in an organic solvent, coating the substrate with the dispersion, and drying the dispersion. In this method, the metallic nanoparticle layer may be formed due to the electrostatic attractive force between the surface of metallic nanoparticles and the surface of the first electrode, which has a polarity opposite to that of the surface of metallic nanoparticles (*JACS*, 125, 14280 (2003)).

The metallic nanoparticles are not particularly restricted, and examples thereof may include, but are not necessarily limited to, metallic nanoparticles of gold, silver, copper, platinum, palladium, tungsten, nickel, tantalum, bismuth, lead, tin, zinc, titanium, and aluminum. The metallic nanoparticles may be those of a metal element, an alloy of two different metals, or a core-shell structured metal.

The metallic nanoparticles may be produced by any method known or appreciated by those in the art. For example, metallic nanoparticles may be produced by reducing an aqueous solution of a particular salt of the metal with citrate, ethylene diaminetetraacetic acid (EDTA), and a reducing agent, e.g., $NaBH_4$. For better stability of the particles, a surfactant, e.g., sodium oleate, may be used.

The acid-treated metallic nanoparticles may be dispersed in a suitable organic solvent. Examples of organic solvents that may be used to disperse the metallic nanoparticles include, but are not necessarily limited to, DMF, 4-hydroxy-4-methyl-2-pentanone, ethylene glycol monoethyl ether, and 2-methoxyethanol. The amount of the metallic nanoparticles dispersed may be about 0.2-15 parts by weight with respect to about 100 parts by weight of the organic solvent, but is not especially limited to this range.

On the other hand, a conductive or non-conductive polymer, such as a polymeric binder, may be added to the organic solvent to impart good uniformity and various functions to a thin film of the metallic nanoparticles. The conductive polymer may be selected from the group consisting of polyacetylene, polythiophene (PT), poly(3-alkyl)thiophene (P3AT), polypyrrole (PPY), polyisothianapthalene (PITN), polyethylene dioxythiophene (PEDOT), polyparaphenylene vinylene (PPV), poly(2,5-dialkoxy)paraphenylene vinylene, polyparaphenylene (PPP), polyheptadiyne (PHT), poly(3-hexyl)thiophene (P3HT), polyaniline (PANI), and mixtures thereof.

The non-conductive polymer may be selected from the group consisting of polyester, polycarbonate, polyvinyl alcohol, polyvinylbutyral, polyacetal, polyarylate, polyamide, polyamideimide, polyetherimide, polyphenylene ether, polyphenylenesulfide, polyethersulfone, polyether ketone, polyphthalamide, polyethernitrile, polybenzimidazole, polycarbodiimide, polysiloxane, polymethylmethacrylate, polymethacrylamide, nitrile rubbers, acrylic rubbers, polyethylenetetrafluoride, epoxy resins, phenolic resins, melamine resins, urea resins, polybutene, polypentene, ethylene-propylene copolymers, ethylene-butene-diene copolymers, polybutadiene, polyisoprene, ethylene-propylene-diene copolymers, butyl rubbers, polymethylpentene, polystyrene, styrene-butadiene copolymers, hydrogenated styrene-butadiene copolymers, hydrogenated polyisoprene, hydrogenated polybutadiene, and mixtures thereof.

The dispersion of the metallic nanoparticles may be uniformly applied to the substrate by any coating technique, such as spin coating, dip coating, spray coating, flow coating, or screen printing. Spin coating may be beneficial in view of the ease and uniformity of coating. When spin coating, the spin speed may be within the range of about 200-3,500 rpm.

The organic memory layer may be formed, for example, by coating the first electrode (i.e. lower electrode) deposited on the substrate with an electrically-conductive organic material (e.g., polyaniline or poly(4-phenylpyridine)) containing heteroatoms. Examples of conductive polymers containing heteroatoms that may be used to form the organic memory layer include, but are not necessarily limited to, polyacetylene; polyphenylacetylene; polydiphenylacetylene; polyaniline; p-phenylene vinylene; polythiophene; polyporphyrins; porphyrinic macrocycles, thiol-derivatized polyporphyrins; polymetallocenes, such as polyferrocenes and polyphthalocyanines; polyvinylines; polystiroles; and mixtures thereof.

The organic memory layer may be formed by a spin-on technique. A mixture of the polymer and a solvent may be deposited on the metallic nanoparticle layer, followed by removal of the solvent to form the organic memory layer on the metallic nanoparticle layer. The organic memory layer thus formed may be substantially uniform.

Techniques for the formation of the organic memory layer are not particularly limited, and examples thereof include spin coating, spray coating, electrostatic coating, dip coating, blade coating, roll coating, and inkjet printing. The organic memory layer may have a thickness of about 50 Å to about 3,000 Å.

At least one solvent selected from the group consisting of water, chloroform, N-methylpyrrolidone, acetone, cyclopentanone, cyclohexanone, methyl ethyl ketone, ethyl cellosolve acetate, butyl acetate, ethyleneglycol, toluene, xylene, tetrahydrofuran, dimethylformamide, chlorobenzene, and acetonitrile may be used to form the organic memory layer by spin coating. A mixture of two or more of these solvents in any ratio may be used.

The first and second electrodes may be made by known processes, including deposition (e.g., thermal evaporation), sputtering, e-beam evaporation, and spin coating.

The organic memory device may further comprise a barrier layer formed on the first electrode or under the second electrode. The barrier layer may be made of a material selected from the group consisting of $SiO_x$, $Al_yO_x$, $NbO_x$, $TiO_x$, $CrO_x$, $V_yO_x$, $TaO_x$, $Cu_yO_x$, $MgO_x$, $WO_x$, and $AlNO_x$, such as $SiO_2$, $Al_2O_3$, $Cu_2O$, $TiO_2$, and $V_2O_3$. The barrier layer may also be formed of an organic material, such as Alq3, polymethylmethacrylate, polystyrene, or PET.

Hereinafter, various example embodiments will be explained in more detail with reference to the following examples. However, these examples are given merely for the purpose of illustration and are not to be construed as limiting the scope of the disclosure.

EXAMPLES

Example 1

A glass substrate washed in acetone and IPA for about 15 minutes each by sonication. Subsequently, a patterned lower electrode was deposited on the washed glass substrate. Aluminum was deposited at a rate of about 1 Å/s to a thickness of about 80 nm on the lower electrode by thermal evaporation to form a second electrode. Poly(allylamine hydrochloride) of about 1 wt % (Aldrich Co.) was dissolved in water by sonication for about 15 minutes, and the aqueous solution was spin-coated at about 5,000 rpm on the lower electrode. Thereafter, a dispersion about 0.1 wt % of platinum (Pt) nanoparticles (diameter: about 3 nm) in an aqueous Tris buffer solution (pH: 8) was spin-coated at about 5,000 rpm and cleaned with water to form a monolayer of the platinum nanoparticles. About 1.3 wt % of poly-3-hexylthiophene (P3HT), which is an electrically-conductive organic material containing heteroatoms, was dissolved in chlorobenzene, spin-coated on the monolayer, and baked at about 110° C. for about 10 minutes to form an organic memory layer.

Copper (Cu) was deposited to a thickness of about 80 nm on the organic memory layer by thermal evaporation to complete the fabrication of an organic memory device according to an example embodiment. The organic memory layer thus formed had a thickness of about 80 nm, as measured using an Alpha-Step profilometer. The thicknesses of the electrodes were controlled using a quartz crystal monitor.

Figure 7A:
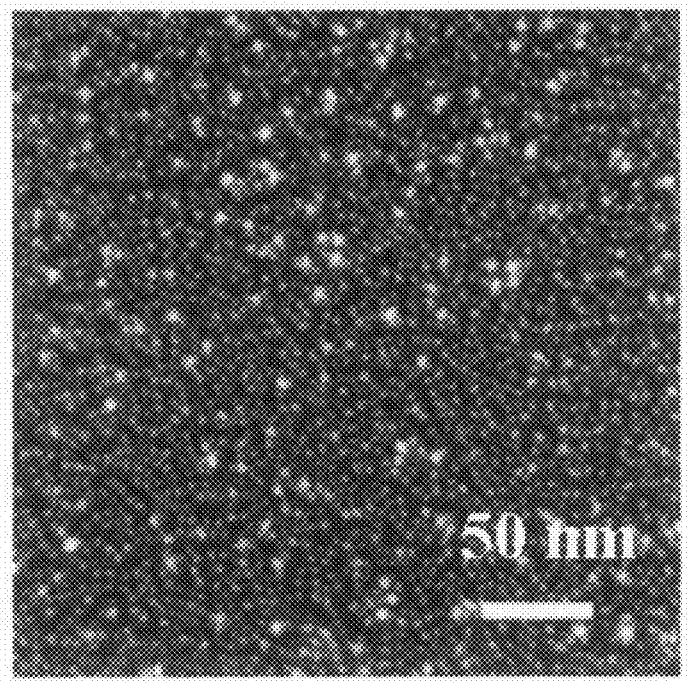
FIGS. 7a and 7b are a surface scanning electron micrograph (SEM) and a cross-sectional transmission electron micrograph (TEM), respectively, showing a portion of a metallic nanoparticle layer of an organic memory device fabricated in Example 1.
Figure 7B:
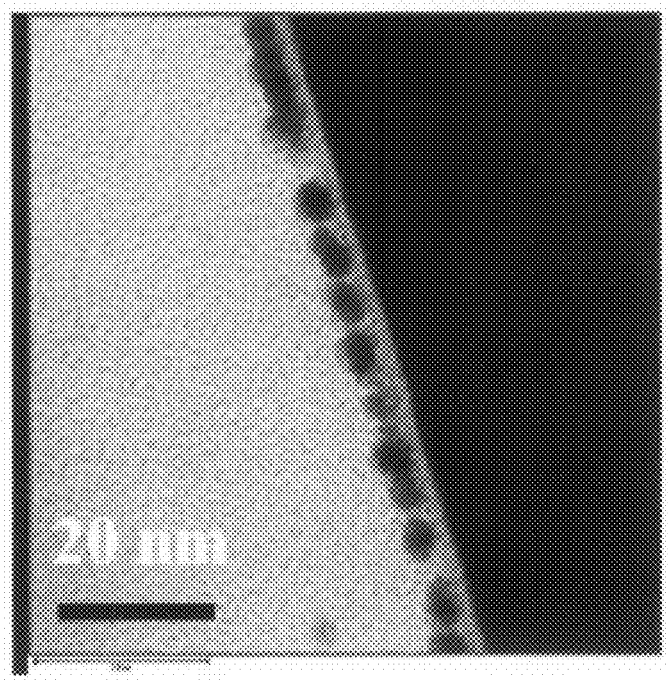

FIGS. 7a and 7b are a surface scanning electron micrograph (SEM) and a cross-sectional transmission electron micrograph (TEM), respectively, showing a portion of the metallic nanoparticle layer of the organic memory device. The micrographs clearly indicate that the metallic nanoparticles were formed in a monolayer at the interface between the lower electrode and the organic memory layer and were uniformly filled.

Comparative Examples 1 and 2

Figure 6:
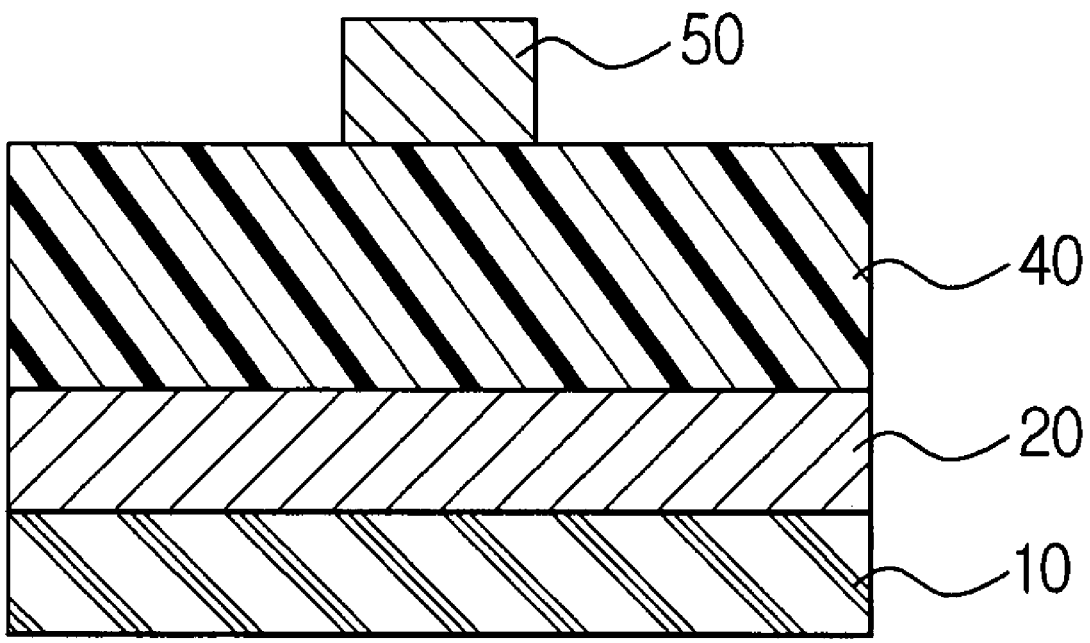
FIG. 6 is a schematic cross-sectional view of a conventional organic memory device fabricated in Comparative Example 1.

Two memory devices were fabricated in the same manner as in Example 1, except that no metallic nanoparticle layer was formed on the lower electrode. Specifically, the memory device shown in FIG. 6 was fabricated in accordance with the following procedure. First, an aluminum first (lower) electrode 20 was formed on a silicon substrate 10. Poly 3-hexylthiophene (P3HT) was spin-coated on the aluminum lower electrode to form an organic memory layer 40. Copper was deposited on the organic memory layer to form a second (upper) electrode 50, thus completing the fabrication of the memory device. One of the memory devices was operated in a bipolar mode (Comparative Example 1), while the other memory device was operated in a unipolar mode (Comparative Example 2) to evaluate the characteristics of the respective devices.

Test Example 1

Test for Switching Characteristics of Memory Devices

The electrical properties of the organic memory devices fabricated in Example 1 and Comparative Examples 1 and 2 were evaluated using a Sourcemeter (Keithley 2400), a digital oscilloscope, and a programmable voltage source (Yokogawa 7651).

Figure 8A:
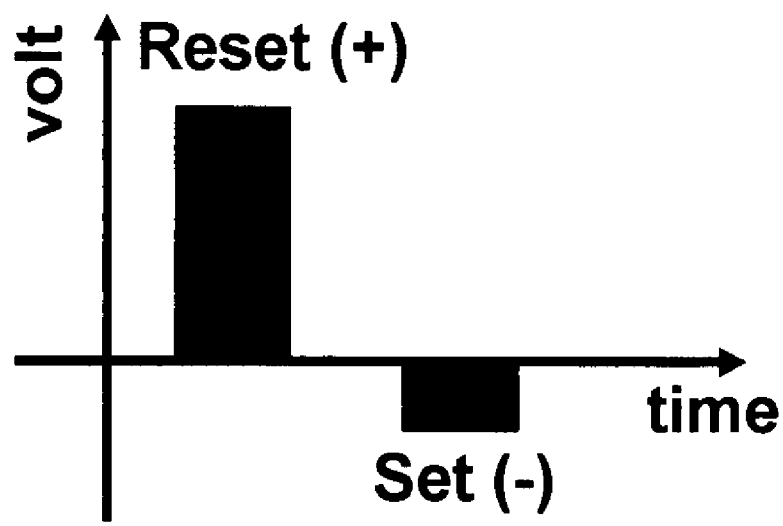
FIG. 8a is a graph showing positive and negative voltages applied to operate a memory device fabricated in Example 1 in a bipolar mode.
Figure 8B:
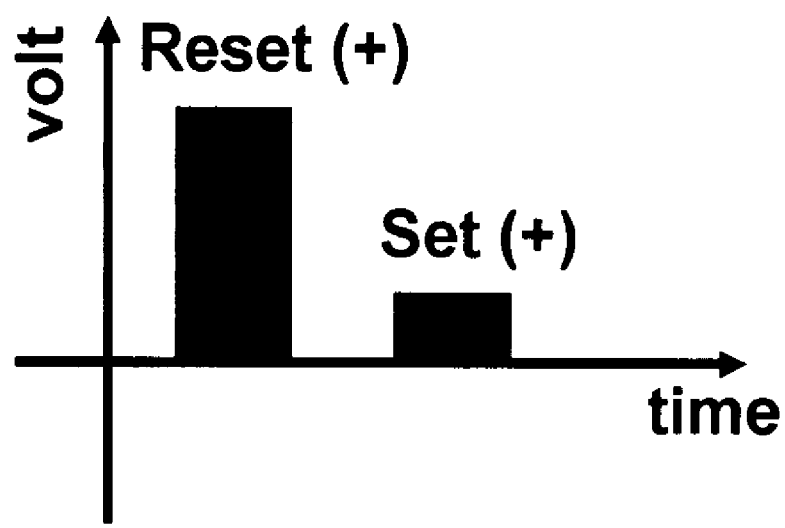
FIG. 8b is a graph showing positive voltages applied to operate a memory device fabricated in Comparative Example 1 in a unipolar mode.
Figure 11A:
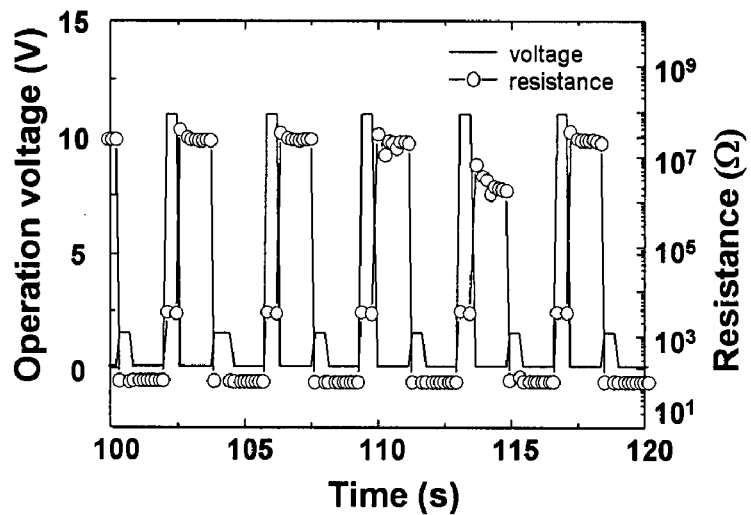
FIG. 11a is a graph showing changes in the operation voltage and resistance of an organic memory device fabricated in Example 1 with increasing switching cycles of the memory device.
Figure 11B:
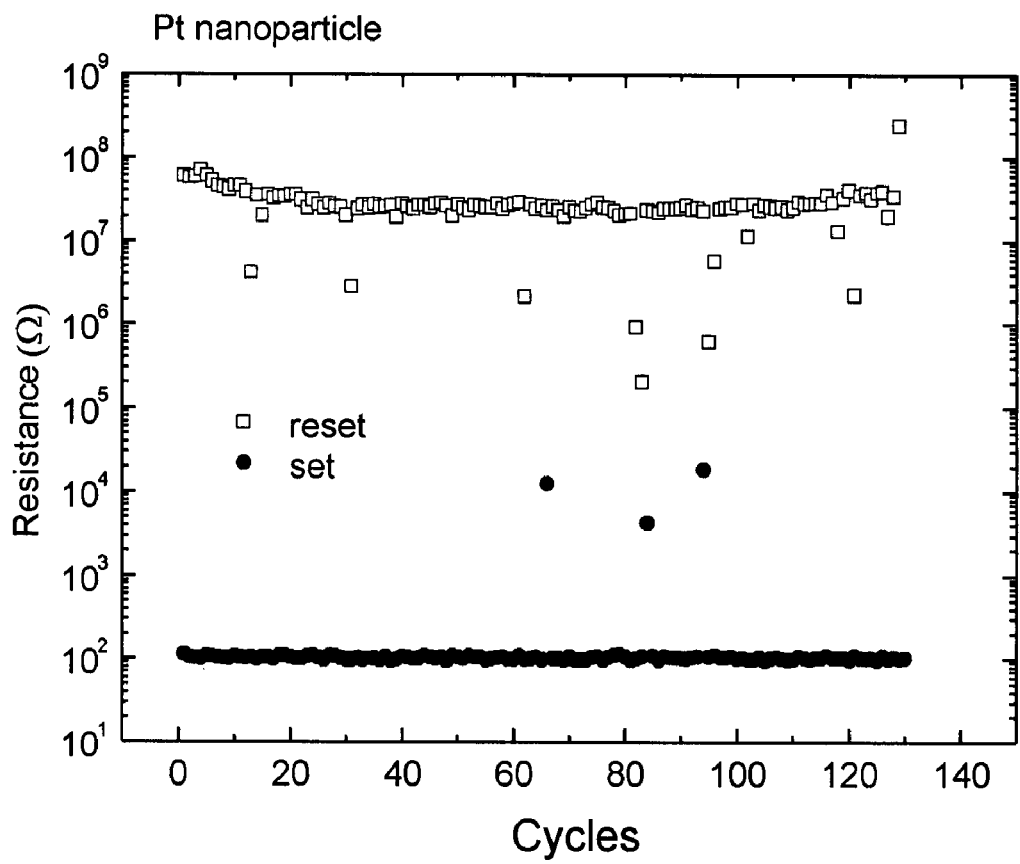
FIG. 11b is a graph showing changes in the resistance state of the organic memory device with increasing switching cycles of the memory device.

As shown in FIG. 8b, pulse voltages of about 0 V, 11 V, 0 V, 1.2 V and 0 V were sequentially and repeatedly applied to the two opposite electrodes of the organic memory device fabricated in Example 1. Changes in current in response to the applied voltages were measured to evaluate the switching characteristics of the organic memory device. The results are shown in FIGS. 11a and 11b. Reset switching of the organic memory device occurred at a voltage of about 11 V, and set switching of the memory device occurred at a voltage of about 1.2 V.

FIG. 11a shows a mode of pulse voltages applied to operate the memory device and changes in the resistance of the device in response to the applied voltages. The application of the voltages was designed in such a manner that a detection voltage (about 0.2 V) was applied between the set pulse voltage (about 11 V) and the reset pulse voltage (about 1.2 V). To determine whether switching of the device occurred or not, the resistance values of the device were measured in response to the respective voltages applied to the device. The resistance of the device after the reset pulse voltage was measured to be on the order of $1 \times 10^5$ ohm and after the set pulse voltage was measured to be on the order of 100 ohm, indicating that switching of the device occurred in a reproducible manner. This procedure was repeated and the resistance values of the device at the detection voltage of every switching cycle were measured. The results are shown in FIG. 11*b*.

As shown in FIG. 8*a*, the organic memory device fabricated in Comparative Example 1 was operated using both negative and positive voltages in a bipolar mode. As shown in FIG. 8*b*, the organic memory device fabricated in Comparative Example 2 was operated using only a positive voltage in a unipolar mode. The electrical properties of the memory devices fabricated in Comparative Examples 1 and 2 were evaluated in the same manner as in the memory device fabricated in Example 1. The results are shown in FIGS. 9*a*, 9*b*, 10*a*, and 10*b*.

Figure 9A:
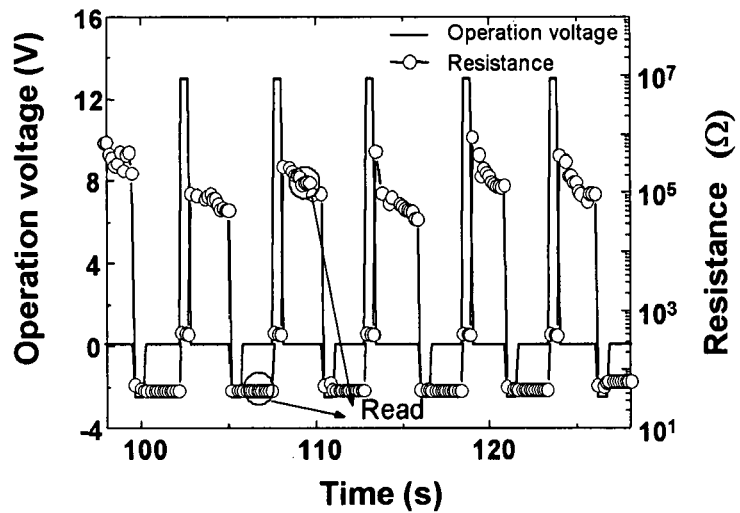
FIG. 9a is a graph showing changes in the operation voltage and resistance of an organic memory device fabricated in Comparative Example 1 with increasing switching cycles of the memory device.

As shown in FIG. 9*a*, when the organic memory device fabricated in Comparative Example 1 was operated in a bipolar mode, the resistance values were lowered at negative voltages (set switching), and the resistance values were increased at positive voltages (reset switching). The resistance values measured after each switching were maintained constant even after tens of cycles (see, FIG. 9*b*). However, when the organic memory device fabricated in Comparative Example 1 was operated using both positive and negative voltages, it could not be operated using only a diode in each cell without the use of a transistor, which indicates that a passive matrix cannot be realized.

Figure 10A:
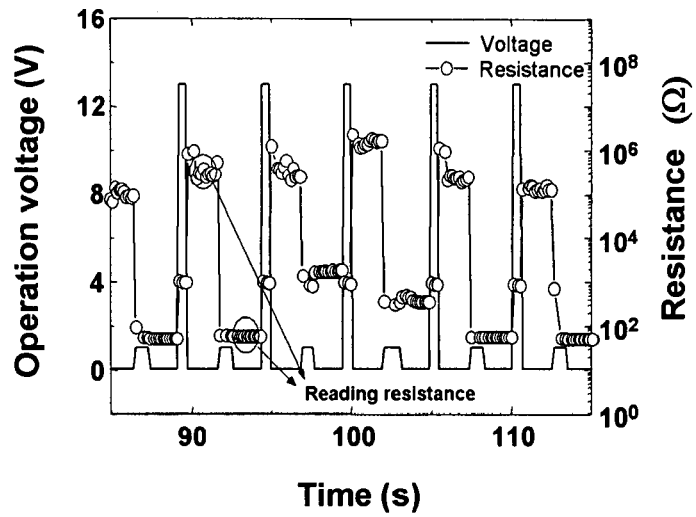
FIG. 10a is a graph showing changes in the operation voltage and resistance of an organic memory device fabricated in Comparative Example 2 with increasing switching cycles of the memory device.
Figure 10B:
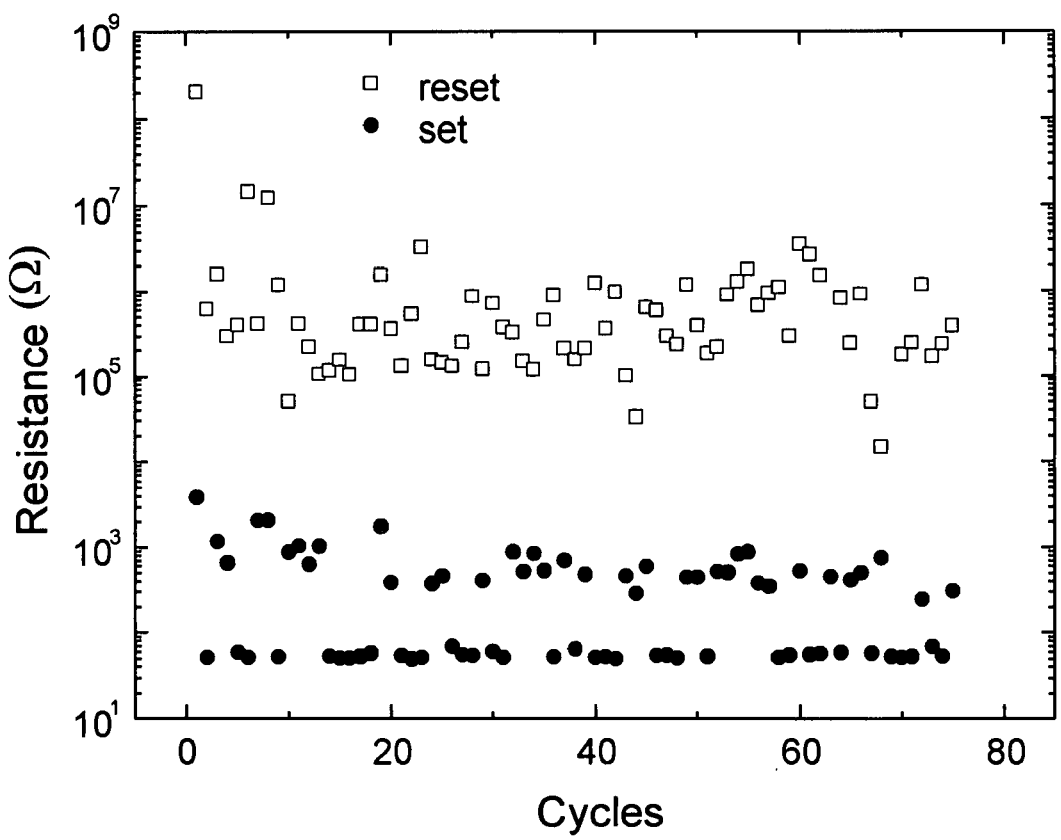
FIG. 10b is a graph showing changes in the resistance state of the organic memory device with increasing switching cycles of the memory device.

As shown in FIG. 10*a*, when the organic memory device fabricated in Comparative Example 2 was operated using positive voltages in a unipolar mode, it was set at about 1.2 V and reset at about 13 V. Two resistance states (about 1 kohm and about 50 ohm) were observed in the set state. As shown in FIG. 10*b*, the organic memory device showed two resistance values with similar probability after each switching during 70 set-reset cycles of the memory device. In this case, control of the two set resistance states was substantially impossible, which indicates that it is difficult to detect memory states of actual memory devices in a stable way.

As shown in FIG. 11*b*, when an organic memory device was operated using only positive voltages (see, FIG. 8*b*), only one resistance state was observed even in set switching. From this observation, it was concluded that the organic memory device can realize a 1D1R device.

Test Example 2

Test for Switching Reproducibility of Memory Devices

Figure 9B:
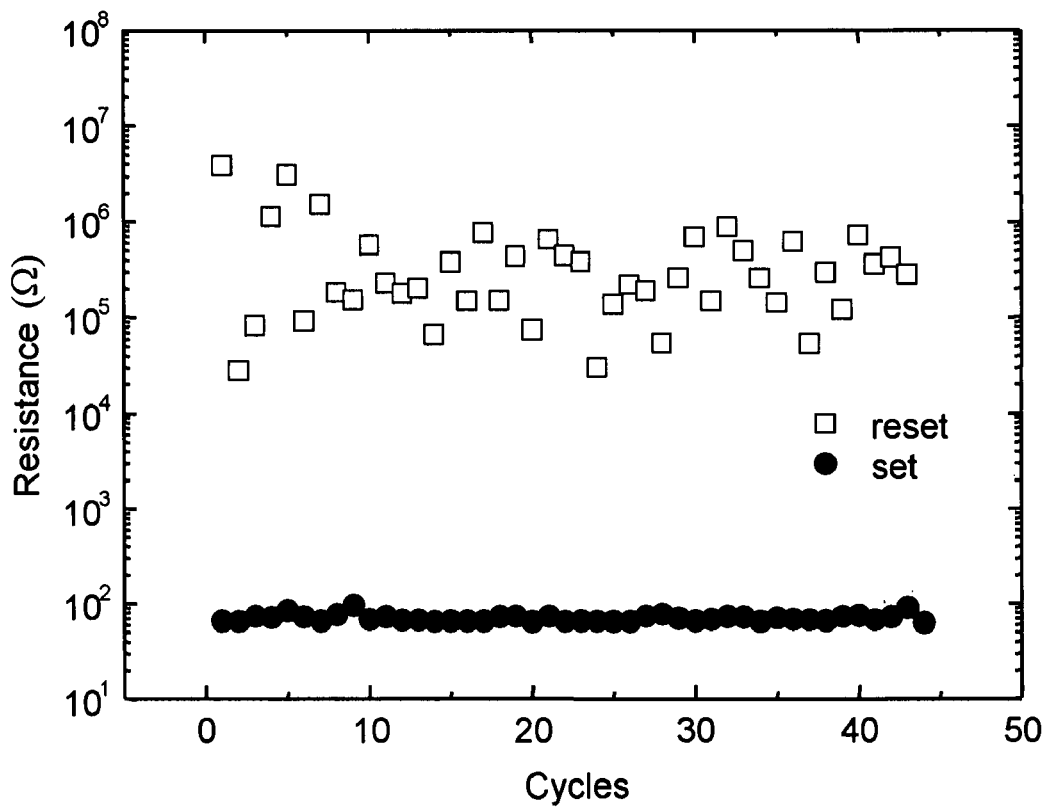
FIG. 9b is a graph showing changes in the resistance state of the organic memory device with increasing switching cycles of the memory device.

To evaluate the switching reproducibility of the memory devices fabricated in Comparative Examples 1 and 2 and Example 1, pulse voltages were applied to the organic memory devices, as shown in FIGS. 8*a* and 8*b*, and changes in current in response to the applied voltages were measured. The respective results are shown in FIGS. 9*b*, 10*b*, and 11*b*. As is evident from these figures, the switching characteristics of the memory devices were evaluated based on the highly reproducible test results during tens of set-reset switching cycles.

Although example embodiments have been disclosed for illustrative purposes, those skilled in the art will appreciate that various modifications and variations may be possible, without departing from the scope and spirit of the invention as disclosed in the appended claims. Accordingly, such modifications and variations are intended to come within the scope of the claims.

Since the organic memory device disclosed herein may be operated using only positive voltages, a 1D1R device composed of one diode and one resistor can be realized and a passive matrix can be realized due to the 1D1R structure. Accordingly, the organic memory device may have a three-dimensional stacking structure, thus achieving high density/high integration characteristics. In addition, the organic memory device achieves short switching time, low operation voltage, low fabrication cost, high reliability, and long-life characteristics. Furthermore, since the organic memory device exhibits superior heat stability and satisfactory non-volatility characteristics, it is well-suited for use in nonvolatile large-capacity storage units. Flexible electrodes may be used in the organic memory device to fabricate flexible memory devices.

What is claimed is:

1. An organic memory device comprising a first electrode, a second electrode, an organic memory layer, and a metallic nanoparticle layer, wherein the organic memory layer is between the first electrode and second electrode, the metallic nanoparticle layer is between the organic memory layer and the first electrode, the metallic nanoparticle layer is in direct contact with the first electrode, the organic memory layer is not between the metallic nanoparticle layer and the first electrode, and the metallic nanoparticle layer is formed as a monolayer structure such that nanoparticles of the metallic nanoparticle layer directly contact both the organic memory layer and the first electrode.

2. The organic memory device of claim 1, wherein the metallic nanoparticle layer comprises metallic nanoparticles having a particle diameter of about 1-10 nm.

3. The organic memory device of claim 1, wherein the metallic nanoparticle layer comprises nanoparticles of a metal selected from the group consisting of gold, silver, copper, platinum, palladium, tungsten, nickel, tantalum, bismuth, lead, tin, zinc, titanium, aluminum, and their alloys.

4. The organic memory device of claim 1, wherein the organic memory layer has an electrical conductivity of about $1.0 \times 10^{-12}$ S/cm or greater.

5. The organic memory device of claim 1, wherein the first electrode comprises at least one material selected from the group consisting of gold, silver, platinum, copper, cobalt, nickel, tin, and aluminum.

6. The organic memory device of claim 1, wherein the organic memory layer comprises an electrically-conductive organic material containing heteroatoms.

7. The organic memory device of claim 6, wherein the heteroatoms are sulfur (S) or nitrogen (N) atoms.

8. The organic memory device of claim 6, wherein the electrically-conductive organic material is selected from the group consisting of polythiophene, poly(3-alkyl)thiophene, polypyrrole, polysiloxane carbazole, polyisothianapthelene, polyethylene dioxythiophene, poly(3-hexyl)thiophene, polyaniline, and mixtures thereof.

9. The organic memory device of claim 6, wherein the electrically-conductive organic material is a polymer, a single molecule, an oligomer, or a dendrimer.

10. The organic memory device of claim 9, wherein the polymer is selected from the group consisting of aniline homopolymers and copolymers, pyrrole homopolymers and copolymers, and vinylpyridine homopolymers and copolymers.

11. The organic memory device of claim 1, further comprising a barrier layer situated between the first electrode and the second electrode.

12. The organic memory device of claim 11, wherein the barrier layer has a thickness of about 20-300 Å.

13. The organic memory device of claim 11, wherein the barrier layer comprises an inorganic material selected from the group consisting of $SiO_x$, $Al_yO_x$, $NbO_x$, $TiO_x$, $CrO_x$, $V_yO_x$, $TaO_x$, $Cu_yO_x$, $MgO_x$, $WO_x$, and $AlNO_x$, or an organic material selected from the group consisting of Alq3, polymethylmethacrylate, polystyrene, and PET.

14. The organic memory device of claim 13, wherein the barrier layer comprises a material selected from the group consisting of $SiO_2$, $Al_2O_3$, $Cu_2O$, $TiO_2$, and $V_2O_3$.

* * * * *